(12) United States Patent
Madsen

(10) Patent No.: US 11,031,772 B2
(45) Date of Patent: Jun. 8, 2021

(54) PROTECTION EARTH CONNECTION DETECTOR

(71) Applicant: Hove A/S, Glostrup (DK)

(72) Inventor: Ivan Madsen, Odense SV (DK)

(73) Assignee: Hove A/S, Glostrup (DK)

( * ) Notice: Subject to any disclaimer, the term of this patent is extended or adjusted under 35 U.S.C. 154(b) by 368 days.

(21) Appl. No.: 15/946,044

(22) Filed: Apr. 5, 2018

(65) Prior Publication Data

US 2018/0294642 A1 Oct. 11, 2018

(30) Foreign Application Priority Data

Apr. 11, 2017 (EP) ..................................... 17165958

(51) Int. Cl.
| | |
|---|---|
| *H02H 7/20* | (2006.01) |
| *H02H 1/00* | (2006.01) |
| *H05K 5/02* | (2006.01) |
| *H02H 3/16* | (2006.01) |
| *G01R 31/50* | (2020.01) |
| *G01R 31/67* | (2020.01) |

(52) U.S. Cl.
CPC .............. *H02H 7/20* (2013.01); *G01R 31/50* (2020.01); *G01R 31/67* (2020.01); *H02H 1/0007* (2013.01); *H02H 3/162* (2013.01); *H05K 5/02* (2013.01)

(58) Field of Classification Search
CPC ........... G01R 31/50; G01R 31/67; H02H 7/20
See application file for complete search history.

(56) References Cited

U.S. PATENT DOCUMENTS

| | | | |
|---|---|---|---|
| 6,322,336 B1 * | 11/2001 | Huss ....................... | D04B 35/28 417/442 |
| 2017/0331270 A1 * | 11/2017 | Mattos ............... | H03K 3/02337 |
| 2018/0111493 A1 * | 4/2018 | Chan ................... | G01R 19/2513 |

FOREIGN PATENT DOCUMENTS

| | | | | |
|---|---|---|---|---|
| DE | 3134924 A1 | * | 3/1983 | .......... H02H 11/001 |
| IN | 3690/CHE/2010 | | 5/2011 | |
| JP | 2009204456 A | * | 9/2009 | |

OTHER PUBLICATIONS

DE3134924 English Translation, downloaded from Espacenet, retrieved Jun. 10, 2020 (Year: 2020).*
JP2009204456 English Translation, downloaded from Espacenet, retrieved Jun. 10, 2020 (Year: 2020).*

* cited by examiner

*Primary Examiner* — Minh Q Phan
(74) *Attorney, Agent, or Firm* — Ice Miller LLP

(57) ABSTRACT

A device for detecting and/or monitoring a protective earth connection in a mains electricity outlet includes an electrical current conducting unit between the line wire and/or neutral wire of the mains electricity and the protective earth wire allowing the flow of a detection current between the line wire and/or neutral wire and the protective earth wire. The device is furthermore configured for measuring the detection current and comparing the detection current with a preselected reference current. A method for detecting and/or monitoring a protective earth connection in a mains electricity outlet includes the steps of measuring a detection current from the line wire and/or neutral wire of the mains electricity through an electrical current conducting unit to the protective earth wire, and comparing the measured detection current to a preselected reference current.

28 Claims, 1 Drawing Sheet

PROTECTION EARTH CONNECTION DETECTOR

CROSS-REFERENCE TO RELATED APPLICATION

This application claims priority under 35 U.S.C. § 119(b) to European Patent Application No. 17165958.4, filed Apr. 11, 2017, the disclosure of which is incorporated herein by reference in its entirety.

The present invention relates to a device for detecting connection to protective earth in mains electricity.

BACKGROUND OF INVENTION

Electrical appliances are used for various purposes both in homes and for industrial applications. Class I appliances are required to have their chassis connected to electrical earth, also called protective earth (PE), by a separate earth conductor. Single-phase electric power normally consists of two wires carrying the current, called the line wire and the neutral wire, and a third wire for PE. The PE is an added safety feature for electrical appliances, as no single failure will lead to a person being exposed to dangerous voltages. In case a current is present in the PE wire, a fuse or circuit breaker immediately disconnects the appliance from the mains electricity. This safety feature relies on the PE wire to actually be connected to earth. Thus it is very problematic that the PE in an outlet is not monitored. Besides, some appliances have a leakage current from e.g. filters that flows between the current carrying wires and the PE wire. If the PE of the outlet is not connected to earth, this leakage current may flow through the chassis of the appliance, through a person touching the appliance to earth. This leakage current is relatively large for many class I appliances, but it is not large enough to be dangerous. However, it is large enough to be felt and cause discomfort for the person exposed to the current. Even though the current itself is not dangerous, the associated discomfort may lead to dangerous situations such as falling from a ladder.

A device for measuring that PE is connected to earth has previously been disclosed. The device measures the voltage difference between the line and/or neutral wire and the PE wire. The PE is assumed connected to earth if the measured voltage is less than a predefined value. However, this method does not work in all cases. If a person is touching the chassis of the electrical appliance, the chassis and thereby the PE of the appliance is connected to earth through the person touching the appliance and not through the PE of the outlet. This may therefore lead to the false conclusion that the PE is connected to earth. Thus, a new and reliable method for determining if the PE is in fact connected to ground is needed.

SUMMARY OF INVENTION

In a first aspect, the present disclosure relates to a device for detecting and/or monitoring a protective earth connection in a mains electricity outlet. The device is comprised of an electrical current conducting unit between a line wire and/or a neutral wire and a protective earth wire of the mains electricity outlet allowing the flow of a detection current between the line wire and/or neutral wire and the protective earth wire. The device is furthermore configured for measuring the detection current and comparing the detection current with a preselected reference current.

This is an advantageous method for detecting protection earth connection as the device actually measures where the current flows. The previously mentioned voltage measurement method is unable to determine if the current flows to earth through the PE wire or through a person touching the chassis of the electrical appliance. By measuring the current flowing to PE of the power outlet, the presently disclosed device ensures that the connection is actually established through the PE of the power socket.

The device may furthermore be coupled to a relay such that power is only available to the electrical appliance if a PE connection is detected. The uncomfortable and potentially dangerous leakage current is therefore not present if the PE connection is missing, which thereby greatly reduces the risk of injuries as a consequence of a missing PE connection.

The presently disclosed device is intended to be used for single-phased power outlets, but the device may also be designed and/or used for other types of electricity.

In a second aspect, the presently disclosed invention further relates to a method for detecting and/or monitoring a protective earth connection in a mains electricity outlet. The method comprises the steps of measuring a detection current from a line wire and/or a neutral wire of the mains electricity outlet through an electrical current conducting unit to a protective earth wire, and comparing the measured detection current to a preselected reference current.

In a third aspect of the invention, there is provided a transportable system for delivering lubricant to a lubrication target, comprising a housing; an electrical appliance comprising a pump and motor residing inside the housing, wherein the motor is configured for driving the pump; and the device according to the first aspect of the invention. Lubrication of a target is often performed in inconvenient locations such as wind turbines. When a transportable lubrication system is connected to the mains electricity, a leakage current may flow through a person touching the lubrication system in case the PE is not connected to earth. This may cause discomfort or even scare the person operating the lubrication system and lead to a potentially dangerous situation.

In one embodiment of the system, the device for detecting and/or monitoring a protective earth connection in a mains electricity outlet is implemented as part of the system such that power is only supplied to the electrical appliance if the device detects a PE connection. Thereby, that the risk of injury as a consequence of a missing earth connection is greatly reduced.

DETAILED DESCRIPTION OF THE INVENTION

Figure 1:
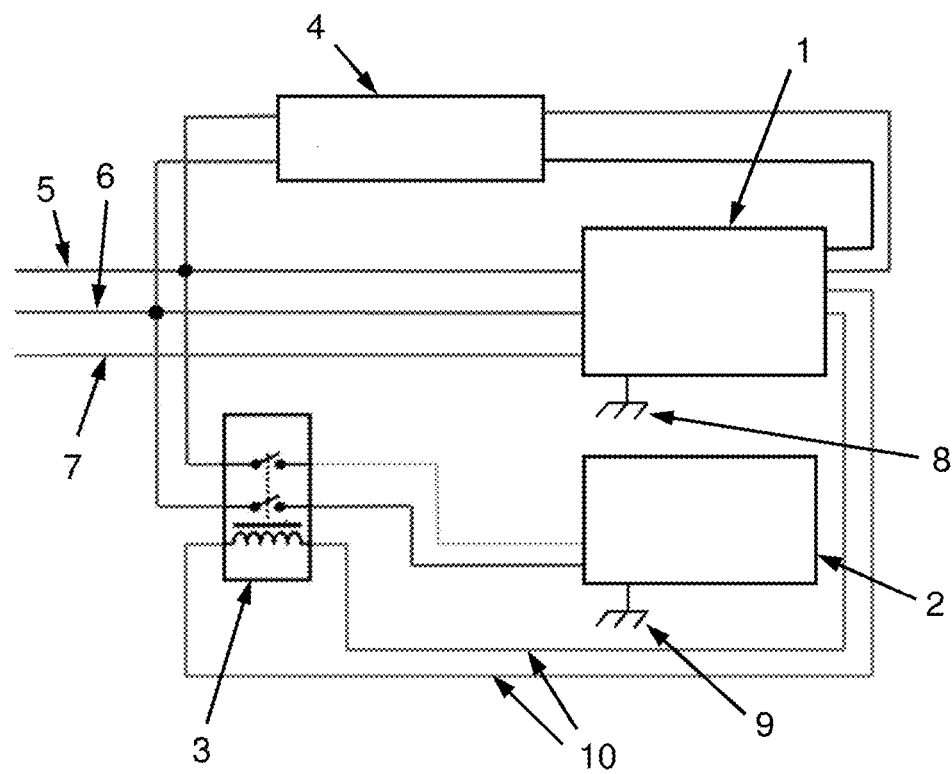
FIG. 1 shows an electrical diagram of one embodiment of the device and an electrical appliance connected to a mains electricity outlet. The diagram shows the device itself, a power supply for the device, an electric appliance connected to the mains electricity and a relay for switching the power to the appliance on or off.

The present disclosure relates to a device for detecting and/or monitoring a protective earth connection in a mains electricity outlet. Preferably, the detection current is measured in the protective earth wire leading to the mains electricity outlet. In one embodiment of the invention, the electrical current conducting unit is connected to the line wire and the protective earth. Thereby, the current will flow from the line wire, through the current conducing unit to the protective earth of the mains electricity outlet. In another embodiment of the invention, the electrical current conducting unit is connected to the line wire and the neutral wire and to the protective earth wire. This configuration is advantageous for situations where the polarity of the line wire and neutral wire may change. For some power outlets such as Type K used in e.g. Denmark, protective earth is supplied by a third pin. Such plugs can only be inserted into a power outlet in one way and the polarity of the line wire and neutral wire is therefore always the same. In such cases it is sufficient to connect the current conducting unit to the line wire only. However, for other outlet types it is possible to insert the plug into the power outlet in two ways with different polarities. One example is the Schuko plug which features two flat contact areas on the top and bottom side of the plug for protective earth. For such plug types where the polarity may change, it is necessary to connect the current conducting unit to both the line wire and neutral wire as these are interchangeable depending on how the plug is inserted into the outlet. Furthermore, in another embodiment of the invention the detection current in the protective earth wire flows in the direction from the device to the protective earth wire of the mains electricity outlet when a connection to PE is present in the outlet.

The present invention is in some embodiments able to prevent connecting an electrical appliance to the mains electricity if the protective earth is not connected to earth. Therefore, in one embodiment of the invention the device further comprises a relay for the mains electricity, wherein the device is configured such that a connection in the relay is only established when the measured detection current is larger than the preselected reference current. In another embodiment the relay is a double pole single throw relay. This means that both the line wire and neutral wire are disconnected if the PE connection is missing, which is especially important for plug types where the polarity may depends on how the plug is inserted into the outlet. In yet another embodiment of the invention an electrical appliance is connected to the outlet. The device may also be an integrated part of an electrical appliance.

The purpose of the device is to determine if the protective earth of a mains electricity outlet is in fact connected to earth or not. In one embodiment the device performs the measurement for detecting the protective earth connection once when the device is plugged in. In another embodiment, the device is configured for continuously measuring the detection current. Thereby, the protective earth connection is continuously monitored by the device.

The previously mentioned current conducting unit conducts the detection current between the line wire and/or neutral wire and the protective earth wire. Preferably, the detection current should be low, such that it does not activate the ground fault circuit interrupter. Even more preferably, the detection current should be so low that it does not cause discomfort for a person exposed to the current and ideally a person should not even notice being exposed to the current. Therefore, the detection current is preferably less than 0.75 mA, more preferably less than 0.50 mA, and most preferably less than 0.25 mA. This means that even if the PE wire is not connected to earth and the detection current therefore passes through a person touching the device, the current is so low that is not felt by the person and does not cause a potentially dangerous situation. The current is limited by the current conducting unit. In one embodiment of the invention the electrical current conducting unit comprises at least one electrical component with a preselected impedance value and/or at least one semiconductor component. In another embodiment the at least one electrical component is chosen from the group; inductor, capacitor and resistor. Electrical components with a preselected impedance value will limit the current flowing through the current conducting unit. In one embodiment the electrical current conducting unit has an impedance value of at least 100 k$\Omega$, or at least 500 k$\Omega$, or at least 1 M$\Omega$, or at least 2 M$\Omega$ at the frequency of the mains electricity.

In case the plug can be inserted in two ways such that the polarity can be switched, the device needs to be connected to both the line wire and the neutral wire. In this embodiment, the current conducting unit comprises a first connection with at least one electrical component for connecting the current conducting unit to the line wire and a second connection with at least one electrical component for connecting the current conducting unit to the neutral wire. The electrical components in each of the two connections have a predefined impedance value. In one embodiment the values of the impedance in the two connections are the same value and in another embodiment the values are different. The two connections ensure that the detection current will flow independently from the polarity of the plug. Additionally, the impedance between the line wire and neutral wire ensures that the current between the line and neutral wire is low.

In a further embodiment of the invention the device further comprises a current transformer for transforming the detection current before measuring the detection current. This current transformer transforms the current in the primary, i.e. the detection current in the PE wire, to a much lower current in the secondary. This may be necessary, as the current in the PE wire can reach large values in case of a short circuit between at least one of the current carrying wires and the PE wire. Transforming the current to a much lower value leads to less strict requirements for the electrical components on the secondary side. A current transformer is often made by winding a primary and secondary wire onto a steel ring. In one embodiment of the invention, the primary is formed merely by passing the PE wire through the iron ring or by winding the PE wire one or a few times around the iron ring. The secondary has e.g. 1000 windings in order to transform the current to a much lower value. This configuration is advantageous, as the PE wire is unaffected by the current transformer. In another embodiment of the invention the device further comprises an electrical connection, having another impedance, between the output wires of the current transformer. It converts the current into voltage and protects the amplifier in case of excessive currents in the protective earth wire.

After the current transformation the current may be very low, making it difficult to measure the current. Therefore, in another embodiment of the invention, the device further comprises an amplifier configured for amplifying the detection current before measuring the detection current. In yet another embodiment the device further comprises a comparator that compares the detection current with the preselected reference current and sends a signal to the relay.

The device may be designed to operate from a variety of voltages and may be powered by a suitable power supply. In one embodiment the power supply for the device is connected to the mains electricity for powering the device.

The presently disclosed invention is further related to a method for detecting and/or monitoring a protective earth connection in a mains electricity outlet. This method comprises the steps of measuring a detection current from the line wire and/or neutral wire of the mains electricity through an electrical current conducting unit to the protective earth wire, and comparing the measured detection current to a preselected reference current. In one embodiment the method further comprises the step of sending a signal to a relay for the mains electricity such that a connection in the relay is only established when the measured detection current is larger than the preselected reference current. In a further embodiment of the invention the detection current is continuously measured and compared to the reference current. In another embodiment the method further comprises the step of transforming the detection current before measuring the current. The method may also comprise the step of amplifying the detection current before measuring the current. In yet another embodiment the method further comprises the step of comparing the detection current to the predefined reference current in a comparator which sends a signal to the relay. Moreover, the device for detecting and/or monitoring a protective earth connection in a mains electricity outlet may be used for the method.

The presently disclosed invention is further related to a transportable system for delivering lubricant to a lubrication target. The system comprises a housing with an electrical appliance comprising a motor and pump residing inside the housing. The motor is configured for driving the pump. The electrical appliance may also include other components such as a processing unit and a power supply. The system furthermore comprises the device for detecting and/or monitoring a protective earth connection in a mains electricity outlet. In one embodiment the system further comprises a container adapted for holding the lubricant. In another embodiment the input for the device is connected to a lead for the mains electricity. In yet another embodiment the output from the relay is connected to the electrical appliance.

DETAILED DESCRIPTION OF THE DRAWINGS

FIG. 1 is an electrical diagram of one embodiment of the invention showing the device 1 for detecting a protective earth connection, an electrical appliance 2 connected to the mains electricity, a relay 3 for turning the power to the electrical appliance on and off, and a power supply 4 for powering the protective earth connection detector. The electricity is supplied through the three wires from the left side of the figure, which are the line wire 5, the neutral wire 6 and the protective earth wire 7. The line wire and protective earth wire are connected to the device 1, the power supply 4 for the device, and to the relay 3 that turns the power for the electrical appliance 2 on and off. The protective earth wire 7 is connected to the device 1. The device 1 is connected to the chassis 8 of the device and the electrical appliance 2 is connected to the chassis 9 of the electrical appliance. Two wires 10 connect the device to the relay for turning the relay on and off. Any of the wire connections may further be fitted with connectors such as a power plug and a mains electricity outlet.

Figure 2:
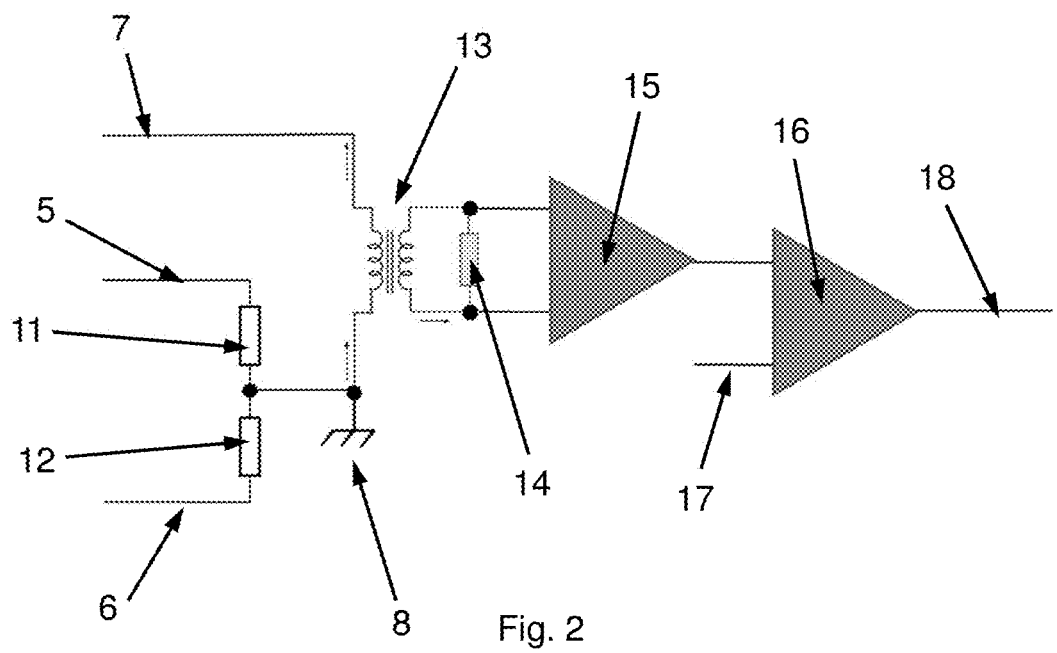
FIG. 2 shows an electrical diagram of one embodiment of the device for measuring protective earth connection in a mains electricity outlet.

FIG. 2 shows an electrical diagram of one embodiment of the device. The mains electricity is supplied though the three wires from the left, which are the line wire 5, the neutral wire 6 and the protective earth wire 7. The line wire 5 is connected to the chassis 8 through at least one electrical component 11 with a preselected impedance value. Similarly, the neutral wire 6 is connected to the chassis 8 through at least one electrical component 12 with a preselected impedance value. This will limit the current that is able to flow into the protective earth wire 7 and between the live wire 5 and the neutral wire 6. The wires are then connected to protective earth 7 through a current transformer 13. The current transformer transforms the current to a much lower value on the secondary. The output from the secondary of the current transformer is connected to an amplifier 15. At least one electrical component 14 with a preselected impedance value is connected between the outputs of the secondary. It converts the current into voltage and protects the amplifier in case of excessive currents in the protective earth wire. The output of the amplifier 15 is connected to a comparator 16, which compares the input to a preselected reference current 17. The output of the comparator 18 is sent to the relay for turning the power to the electrical appliance on if the measured current is larger than the reference current and off if the measured current is lower than the reference current.

The invention claimed is:

1. A device for detecting and/or monitoring a protective earth connection in a mains electricity outlet comprising:
   an electrical current conducting unit between a line wire and/or a neutral wire and a protective earth wire of the mains electricity outlet allowing the flow of a detection current between the line wire and/or neutral wire and the protective earth wire, wherein the electrical current conducting unit is configured to limit the detection current to less than 0.75 mA,
   wherein the device is configured for measuring the detection current and comparing the detection current with a preselected reference current, and wherein the device further comprises a switch or relay configured to establish a connection from the mains electricity outlet to an electrical appliance when the measured detection current is larger than the reference current.

2. The device according to claim 1, wherein the electrical current conducting unit is connected to the line wire and the protective earth.

3. The device according to claim 1, wherein the electrical current conducting unit is connected to the line wire and the neutral wire and to the protective earth wire.

4. The device according to claim 1, wherein the detection current is measured in the protective earth wire leading to the mains electricity outlet.

5. The device according to claim 1, wherein the detection current in the protective earth wire flows in the direction from the device to the protective earth wire of the mains electricity outlet when a connection to protective earth is present in the outlet.

6. The device according to claim 1, wherein the device is configured for continuously measuring the detection current.

7. The device according to claim 1, wherein the electrical current conducting unit comprises at least one electrical component with a preselected impedance value and/or at least one semiconductor component.

8. The device according to claim 7, wherein the at least one electrical component is chosen from the group: inductor, capacitor and resistor.

9. The device according to claim 1, wherein the electrical current conducting unit has an impedance value of at least 100 kΩ, or at least 500 kΩ, or at least 1 MΩ, or at least 2 MΩ at the frequency of the mains electricity.

10. The device according to claim 1, wherein the relay is a double pole single throw relay.

11. The device according to claim 1, further comprising a current transformer for transforming the detection current before measuring the detection current.

12. The device according to claim 1, further comprising an electrical connection, having another impedance, between the output wires of the current transformer.

13. The device according to claim 1, further comprising an amplifier configured for amplifying the detection current before measuring the detection current.

14. The device according to claim 1, further comprising a comparator that compares the detection current with the preselected reference current and sends a signal to the relay.

15. The device according to claim 1, further comprising a power supply connected to the mains electricity for powering the device.

16. The device according to claim 1, wherein an electrical appliance is connected to the outlet.

17. The device according to claim 1, wherein the device is an integrated part of an electrical appliance.

18. A method for detecting and/or monitoring a protective earth connection in a mains electricity outlet comprising:
measuring a detection current from a line wire and/or a neutral wire of the mains electricity outlet through an electrical current conducting unit to a protective earth wire, where said detection current is less than 0.75 mA,
comparing the measured detection current to a preselected reference current, and
establishing a connection from the mains electricity outlet to an electrical appliance when the measured detection current is larger than the preselected reference current.

19. The method according to claim 18, further comprising a step of sending a signal to a relay for the mains electricity such that a connection in the relay is only established when the measured detection current is larger than the preselected reference current.

20. The method according to claim 18, wherein the detection current is continuously measured and compared to the preselected reference current.

21. The method according to claim 18, further comprising a step of transforming the detection current before measuring the current.

22. The method according to claim 18, further comprising a step of amplifying the detection current before measuring the current.

23. The method according to claim 19, further comprising the step of comparing the detection current to the preselected reference current in a comparator which sends a signal to the relay.

24. The method according to claim 18, wherein the steps of measuring the detection current and comparing the measured detection current to a preselected reference current are performed by a device including an electrical current conducting unit between the line wire and/or the neutral wire and a protective earth wire of the mains electricity outlet allowing the flow of a detection current between the line wire and/or neutral wire and the protective earth wire.

25. A transportable system for delivering lubricant to a lubrication target, comprising
a housing;
an electrical appliance comprising a pump and motor residing inside the housing, wherein the motor is configured for driving the pump; and
a device for detecting and/or monitoring a protective earth connection in a mains electricity outlet comprising:
an electrical current conducting unit between a line wire and/or a neutral wire and a protective earth wire of the mains electricity outlet allowing the flow of a detection current between the line wire and/or neutral wire and the protective earth wire, wherein the electrical current conducting unit is configured to limit the detection current to less than 0.75 mA, wherein the device is configured for measuring the detection current and comparing the detection current with a preselected reference current, and wherein the device further comprises a switch or relay configured to establish a connection from the mains electricity outlet to an electrical appliance when the measured detection current is larger than the reference current.

26. The system according to claim 25, further comprising a container adapted for holding the lubricant.

27. The system according to claim 25, wherein the input for the device is connected to a lead for the mains electricity.

28. The system according to claim 25, wherein the output from the relay is connected to the electrical appliance.

* * * * *